(12) United States Patent
Allen et al.

(10) Patent No.: US 6,544,811 B2
(45) Date of Patent: Apr. 8, 2003

(54) MICROMACHINED DEVICE HAVING ELECTRICALLY ISOLATED COMPONENTS AND A METHOD FOR MAKING THE SAME

(75) Inventors: Mark G. Allen, Atlanta, GA (US); Charles C. Chung, Atlanta, GA (US)

(73) Assignee: Georgia Tech Research Corporation, Atlanta, GA (US)

(*) Notice: Subject to any disclaimer, the term of this patent is extended or adjusted under 35 U.S.C. 154(b) by 6 days.

(21) Appl. No.: 09/766,521

(22) Filed: Jan. 19, 2001

(65) Prior Publication Data

US 2001/0006248 A1 Jul. 5, 2001

(51) Int. Cl.[7] .................. H01L 21/00; H01L 21/76; H01L 21/22; H01L 21/38
(52) U.S. Cl. ................. 438/52; 438/53; 438/415; 438/550; 438/556
(58) Field of Search .................. 438/50, 51, 52, 438/53, 415, 550, 556

(56) References Cited

U.S. PATENT DOCUMENTS

| | | | | |
|---|---|---|---|---|
| 4,173,496 A | * | 11/1979 | Chiang et al. | 136/89 |
| 4,625,561 A | * | 12/1986 | Mikkor | 73/724 |
| 5,480,811 A | * | 1/1996 | Chiang et al. | 437/3 |

OTHER PUBLICATIONS

"Zone Melting" 2nd Ed., by William G. Pfann, Metallurgical Research Laboratory Bell Telephone Laboratories ©1958, 1966 by John Wiley & Sons, Inc.; Library of Congress Catalog Card 65–27655, pp. 254–268.

"Thermomigration of aluminum–rich liquid wires through silicon" by H.E. Cline and T.R. Anthony, Journal of Applied Physics, vol. 47, No. 6, 06/76, pp. 2332–2336.

"Thermomigration Processing of Isolation Grids in Power Structures", by Thomas R. Anthony; John K. Boah; Mike F. Chang and Harvey E. Cline, IEEE Trans. on Electron Devices, vol. ED–23, No. 8, 08/76, pp. 818–822.

"A silicon–Based, Three–Dimensional Neural Interface: Manufacturing Processes for an Intracortical Electrode Array", by Patrick K. Campbell; Kelley E. Jones; Robert J. Huber; Kenneth W. Horch, and Richard A. Normann, IEEE, Biomedical Engineering, vol. 38, No. 8, 08/91, pp. 758–767.

"ISAAC—Integrated Silicon Automative Accelerometer" by Leland "Chip" Spangler and Christopher J. Kemp (Jun. 25–29, 1995) pp. 585–588.

"Scream MicroElectroMechanical Systems" by Noel C. MacDonald, (1996), pp. 49–73.

"Bulk micromachined silicon comb–drive electrostatic actuators with diode isolation" by R.R.A. Syms; B.M. Hardcastle; R.A. Lawes; Sensors and Actuators A 63 (1997) pp. 61–67.

"Deep Diffusions and Soi Layers Produced by Rapid Thermal Processing for Smart Power Applications", by J.M. Dilhac, L. Cornibert, C. Ganibal; Mat. Res. Soc. Symp. Proc. vol. 470 (1997) pp. 319–324.

"Embedded Interconnect and Electrical Isolation for High–Aspect–Ratio, SOI Inertial Instruments" by Timothy J. Brosnihan, James M. Bustillo, Albert P. Pisano, and Roger T. Howe (Jun. 16–19, 1997), pp. 637–640.

* cited by examiner

*Primary Examiner*—John F. Niebling
*Assistant Examiner*—Viktor Simkovic
(74) *Attorney, Agent, or Firm*—Thomas, Kayden, Horstemeyer & Risley, L.L.P.

(57) ABSTRACT

A micromachined structure having electrically isolated components is formed by thermomigrating a dopant through a substrate to form a doped region within the substrate. The doped region separates two portions of the substrate. The dopant is selected such that the doped region electrically isolates the two portions of the substrate from each other via junction isolation.

30 Claims, 5 Drawing Sheets

MICROMACHINED DEVICE HAVING ELECTRICALLY ISOLATED COMPONENTS AND A METHOD FOR MAKING THE SAME

BACKGROUND OF THE INVENTION

1. Field of the Invention

The present invention generally relates to micromachining techniques and, in particular, to a micromachined electro-mechanical device having components electrically isolated from each other via junction isolation and to a method for making the same.

2. Related Art

A microelectromechanical system (MEMS) may include a movable component, such as a spring or a flexure, for example, that moves or actuates when a voltage difference is applied between the movable component and another portion of the system. Such systems are often employed to effect sensing or actuation on a small scale. However, each MEMS is typically small, usually less than a few hundred microns in thickness, and formation of each MEMS and, in particular, the movable components within each MEMS can be difficult and expensive using conventional machining technologies.

Many specialized techniques exist for the fabrication of a MEMS. For example, in forming a MEMS, a substrate of suitable material can be etched via a suitable process, such as inductively coupled plasma reactive ion etching (ICP-RIE), for example, to form both the movable and non-movable components of the MEMS. To enable a voltage difference to be applied across the movable components, the substrate and, hence, the movable components are usually conductive or semiconductive. A semiconductive material, such as silicon, is often used to form the substrate. Indeed, single crystal silicon (SCS) is often a preferred material for use as a substrate in a MEMS, as SCS has excellent mechanical properties, such as fatigue resistance, for example, in addition to good electrical properties. Further, SCS works well with the etching techniques commonly employed in forming the movable components. There are various other advantages to utilizing SCS as a substrate material in a MEMS. These advantages should be readily apparent to one skilled in the art, and further elaboration on these advantages will not be provided herein.

Adding to the complexity of many microelectromechanical systems is the fact that each movable component formed within a substrate should be electrically isolated from other (e.g., non-movable) portions of the substrate. As previously described, a movable component of a substrate is normally formed by etching the substrate. Thus, the movable component is usually comprised of the same conductive or semiconductive material as the other portions of the substrate, and additional steps are usually required to electrically isolate the movable component from the other portions of the substrate. If the movable component is not electrically isolated, then it is not usually possible to move or actuate the movable component by applying a voltage difference across the movable component and another portion of the substrate as the voltage difference will be shorted out.

Significant research has been devoted to developing methodologies for electrically isolating a movable component within a SCS substrate of a MEMS. One methodology presently used to electrically isolate the movable component includes the step of bonding a first substrate to a handle substrate and then completely etching away all portions of the first substrate between the movable component and the non-movable portions of the first substrate. Thus, the movable component is completely separated from the non-movable portions, and the handle substrate provides mechanical support for the etched substrate and maintains alignment of the movable component with respect to the non-movable portions of the etched substrate. However, utilization of the handle substrate often introduces complexities that make the fabrication of the resulting MEMS more difficult and/or expensive. For example, in structures that require symmetry, the handle substrate may undesirably add a significant amount of mass to one side of the structure, and for fluidic structures, the handle substrate may block or impede fluid flow into and out of the structure.

A second methodology developed to electrically isolate the movable component formed within a substrate of a MEMS also includes the step of completely etching away all portions of the substrate between the movable component and the non-movable portions, as described above. Thus, the movable component is completely separated from the non-movable portions of the substrate. A material, such as silicon dioxide, for example, is then backfilled into the etched spaces of the substrate in an attempt to restore the mechanical integrity of the substrate. Therefore, the movable component and the non-movable portions are held together by the backfilled material, and a handle substrate is not necessary. However, the backfilled material often has mechanical properties that are inferior to the material of the substrate, thereby reducing the mechanical integrity of the resulting structure. Further, the mechanical integrity of the structure depends on how well the backfilled material adheres to the etched substrate. Indeed, in many structures, the bond between the backfilled material and the etched substrate is a limiting factor in the overall mechanical integrity of the structure.

A third methodology developed to electrically isolate the movable component includes the step of etching a substrate to form the movable component. However, the movable component is not completely separated from the non-movable portion of the substrate, and the non-movable portion of the substrate provides mechanical support for the movable component. After etching the substrate to form the movable component, an insulating layer is grown or deposited on the substrate. Then, conductive layers (e.g., metallic films) are deposited on the insulating layer as necessary to enable a voltage difference to be applied across the movable component and another portion of the substrate. However, the formation of the insulative and conductive layers can be a difficult and/or an expensive process. In this regard, metallization of the sidewalls or, in other words, the portions within the etched regions of the substrate is typically required to provide a suitable voltage difference for actuating the movable component. Performing photolithography or other metallization techniques within this non-planar region can be particularly problematic and difficult.

Diffusion has been used in attempts to electrically isolate, via junction isolation, portions of a micromachined device from other portions of the micromachined device. In this regard, a dopant is diffused into a layer of a microfabricated structure in order to change the electrical properties of the doped region, which resides between two regions of the layer that are to be electrically isolated from each other. More specifically, the electrical properties of the doped region are changed such that the doped region better resists the flow of electricity between the two regions that are separated by the doped region.

For example, it is well known in the art that p-type and n-type semiconductors can be formed by diffusion of appropriate dopants into semiconductive material. Further, it is well known in the art that a junction between p-type semiconductor material and n-type semiconductor material will allow electrical current to pass easily in one direction but will restrict current flow in the opposite direction. Such a junction is commonly referred to as a diode. Two properly designed diode structures formed in series, therefore, will restrict the flow of current in either direction, thereby creating a junction isolation. Unfortunately, there exists practical limitations to the use of diffusion to effect junction isolation.

In particular, a dopant usually must be diffused through the entire thickness of a layer (i.e., from a top surface of the layer to the bottom surface of the layer) in order to electrically isolate two portions of the layer. In this regard, if the dopant is diffused through only the top portion of the layer, then current is able to flow through the bottom portion of the layer. In such a case, portions of the layer residing on opposite sides of the doped region would not be electrically isolated from each other.

It is not practical to employ diffusion techniques for the purpose of junction isolation in many MEMS applications. In this regard, utilization of diffusion to effect junction isolation in silicon is normally limited to layers having a thickness of less than approximately 10 microns. This is due primarily to the relatively low diffusion coefficients (and therefore unacceptably long times required for diffusion) for electrically active, substitutional dopants in silicon. Further, the conventional diffusion process is isotropic in nature. Even if the large diffusion depths required could be achieved, the lateral spread of the dopants would be, at minimum, approximately equal to twice the depth of diffusion, resulting in unacceptably large spacing requirements between MEMS components.

Thus, as set forth hereinabove, the thickness of most substrates used to form movable components in a MEMS is normally greater than 10 microns in order to achieve the desired mechanical stability, yet utilization of diffusion to effect junction isolation in silicon is normally limited to layers having a thickness of less than approximately 10 microns. Therefore, diffusion is normally an unsuitable technique for electrically isolating a movable component of a MEMS from other portions of the MEMS. Indeed, significant research has been devoted to discovering better methodologies for electrically isolating movable components that are on the order of tens to hundreds of microns in thickness.

Thus, a heretofore unaddressed need exists in the industry for an improved methodology for electrically isolating a movable component within a MEMS, particularly a MEMS having a movable component that is tens to hundreds of microns in thickness.

SUMMARY OF THE INVENTION

The present invention overcomes the inadequacies and deficiencies of the prior art as discussed hereinbefore. Generally, the present invention provides a micromachined device having electrically isolated components and a method for making the same.

A micromachined structure according to the present invention includes a semiconductive substrate. Two portions of the substrate are electrically isolated from each other via a doped region residing between the two portions. The doped region is preferably formed via thermomigration and has electrical properties that restrict current from flowing between the two portions.

Other features and advantages of the present invention will become apparent to one skilled in the art upon examination of the following detailed description, when read in conjunction with the accompanying drawings. It is intended that all such features and advantages be included herein within the scope of the present invention and protected by the claims.

BRIEF DESCRIPTION OF THE DRAWINGS

The invention can be better understood with reference to the following drawings. The elements of the drawings are not necessarily to scale relative to each other, emphasis instead being placed upon clearly illustrating the principles of the invention. Furthermore, like reference numerals designate corresponding parts throughout the several views.

DETAILED DESCRIPTION OF THE PREFERRED EMBODIMENT

The present invention generally relates to a micromachined device having electrically isolated components and a method for making the same. In accordance with a preferred embodiment of the present invention, a movable component is formed within a substrate via any suitable micromachining technique, such as inductively coupled plasma reactive ion etching (ICP-RIE), for example. Further, thermomigration techniques are utilized to change the electrical properties of the substrate in a region separating the movable component from other portions of the substrate. The electrical properties of this region are changed such that the region insulates the movable component from the other portions of the substrate. Thus, the movable component is electrically isolated from the other portions of the substrate.

Figure 1:
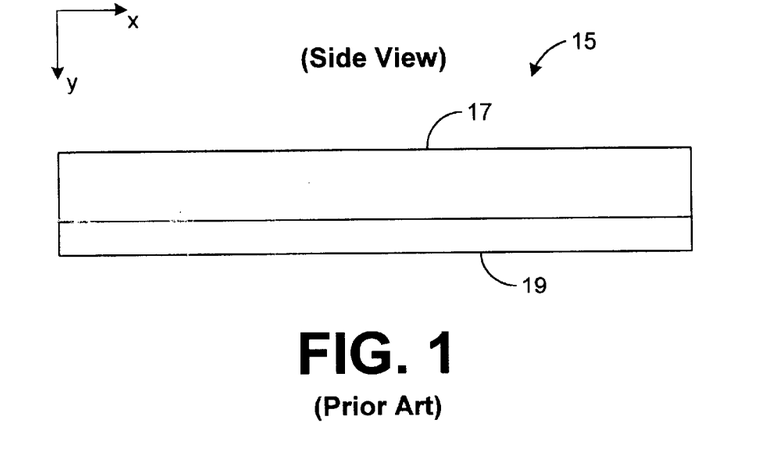
FIG. 1 is a diagram illustrating a side view of a micromachined device in accordance with the prior art.

Thermomigration is a process that was experimentally employed many decades ago in attempts to manufacture electrical devices. In this regard, it was discovered that thermomigration could be used to dope regions of a semiconductor, thereby changing the electrical properties of the doped regions. For example, refer to FIG. 1, which depicts a device 15 having a semiconductive layer 17 of n-doped silicon formed on a substrate 19. In some applications, it may be desirable to stack another device (not shown) on top of layer 17 and to electrically connect components in the other device (not shown) with the substrate 19. Thermomigration techniques may be used to enable such an electrical connection.

Figure 2:
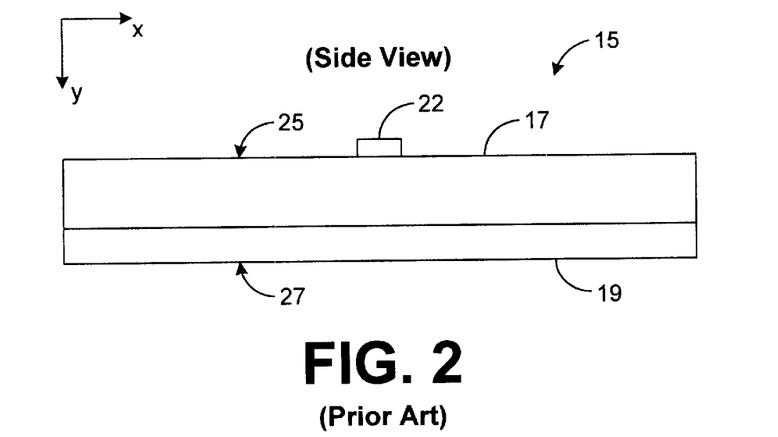
FIG. 2 is a diagram illustrating the device of FIG. 1 after forming a dopant on the top surface of the device.
Figure 3:
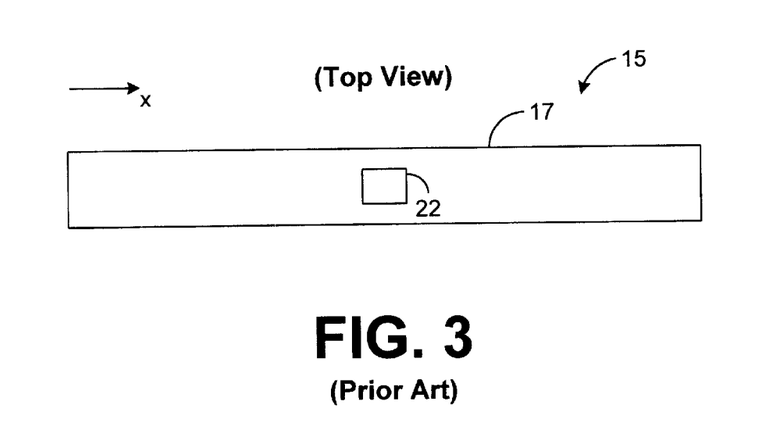
FIG. 3 is a diagram illustrating a top view of the device depicted in FIG. 2.

In this regard, a p-dopant 22 (e.g., aluminum) is deposited on a surface 25 of an n-doped silicon layer 17, as shown by FIGS. 2 and 3. Then, a heat source (not shown) is placed in close proximity to a surface 27 to heat the device 15 from a side opposite of the dopant 22, thereby creating a thermal gradient through the device 15 substantially parallel to the y-direction. The heat source produces a sufficient amount of heat to cause the dopant 22 to thermomigrate through the layer 17 until the substrate 19 is reached or until the material of the dopant 22 is exhausted.

Figure 4:
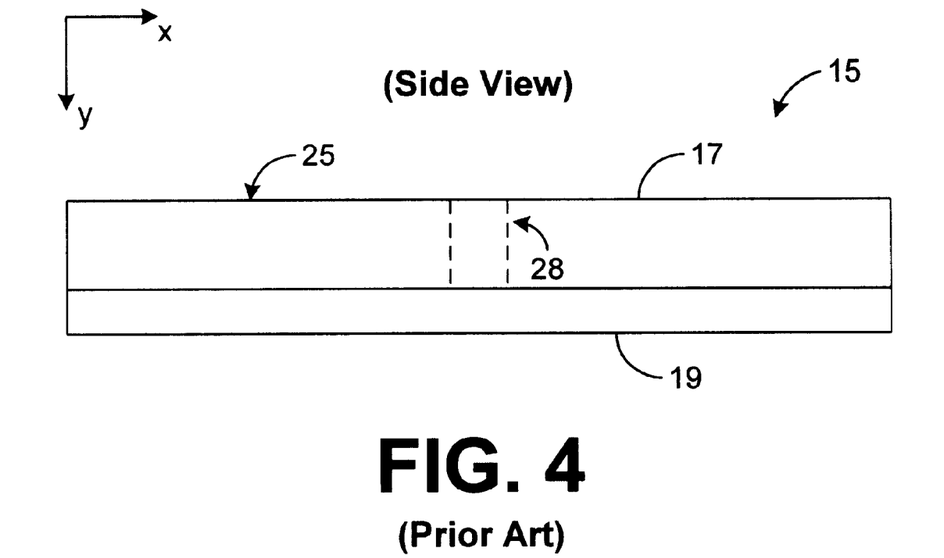
FIG. 4 is a diagram illustrating the device of FIG. 2 after thermomigrating the dopant through the device.
Figure 5:
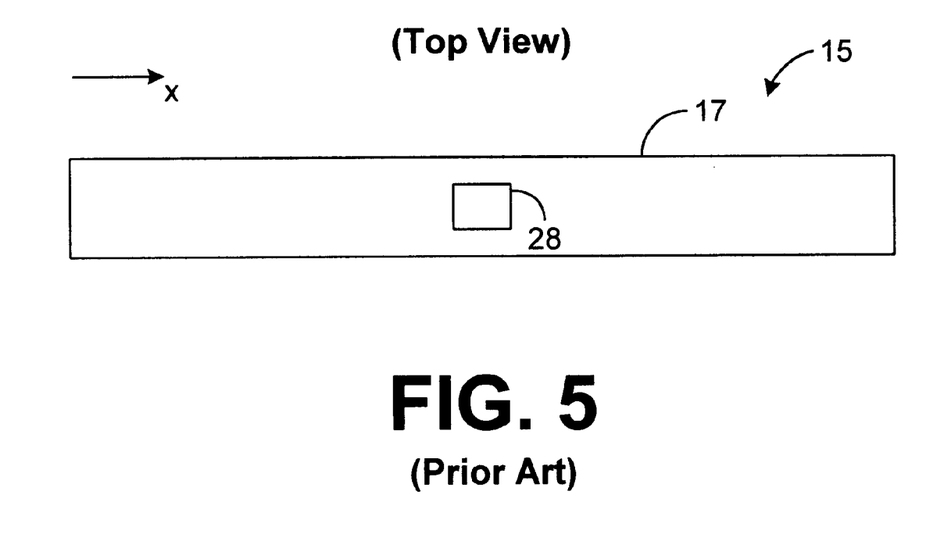
FIG. 5 is a diagram illustrating a top view of the device depicted in FIG. 4.

FIGS. 4 and 5 depict the device 15 once the dopant 22 has been thermomigrated through layer 17. The region 28 of the layer 17 through which the dopant 22 has thermomigrated should have different electrical characteristics than the remainder (i.e., the n-doped regions) of layer 17. More specifically, in the foregoing example, the thermomigration of the aluminum through the silicon layer 17 forms a p-type region 28 in the layer 17. This p-type region 28 may be used as a conductor between the substrate 19 and a device (not shown) formed on the surface 25 of layer 17.

However, conductive regions formed via thermomigration techniques typically exhibit relatively high capacitance when current is passed through the conductive regions. This high capacitance reduces the speed at which signals can be communicated through the conductive regions. As a result, the process of forming conductive vias in devices through thermomigration has not been implemented in practice to any significant extent. Indeed, most researchers no longer devote significant research to the utilization of thermomigration for forming conductive vias as previously described. Although experiments utilizing thermomigration for other purposes have occurred, widespread commercial use of thermomigration has, for the most part, not materialized.

However, these thermomigration techniques, once experimentally used to form conductive vias, may be used to electrically isolate one or more movable components in a MEMS, as will be described in further detail hereafter. Since thermomigration enables a relatively thick layer (e.g., on the order of tens to hundreds of microns in thickness) to be quickly and efficiently doped through the entire thickness of the layer, thermomigration provides a practical and efficient methodology for effecting junction isolation within most microelectromechanical systems, particularly microelectromechanical systems having movable components that should be electrically isolated. Furthermore, since the movable components of most microelectormechanical systems move at slow speeds relative to commonly used electrical signal frequencies, the capacitance issue that prevented the use of thermomigration in many prior applications is not a significant limiting factor in the present invention. To better illustrate the methodology of the present invention, refer to FIG. 6, which depicts a substrate 52 that is to be used to form a MEMS having a moving component electrically isolated from other portions of the substrate 52.

Figure 6:
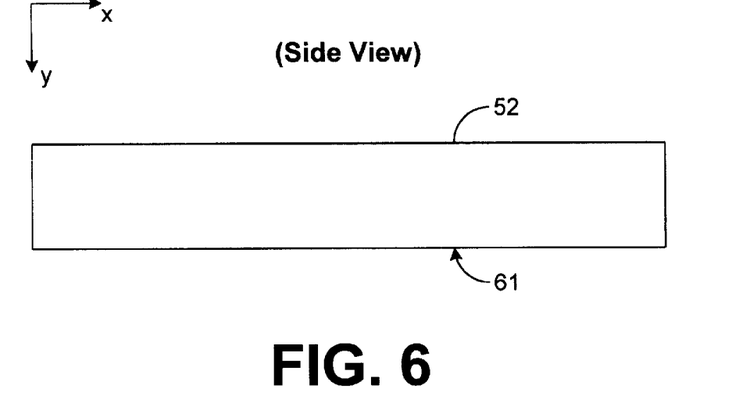
FIG. 6 is a diagram illustrating a side view of a substrate that is to be modified in accordance with the present invention.

In the preferred embodiment, the substrate 52 is an n-type semiconductor, such as a single crystal silicon (SCS) substrate, for example. At present, most SCS substrates that are etched to form movable components have a thickness (i.e., distance in the y-direction) of at least approximately 25–50 microns and usually on the order of hundreds of microns in order to provide the resulting structure with sufficient mechanical integrity. For the same reason, the thickness of the substrate 52 is at least approximately 25–50 microns in the preferred embodiment, and in many applications (e.g., the fabrication of high sensitivity, low noise MEMS gyroscopes and accelerometers), it will be desirable for the thickness of the substrate 52 to be on the order of hundreds of microns. However, it should be noted that, if desired, the methodology of the present invention may be employed with substrates 52 of various other sizes, including substrates 52 having a thickness of less than 25 microns.

Figure 7:
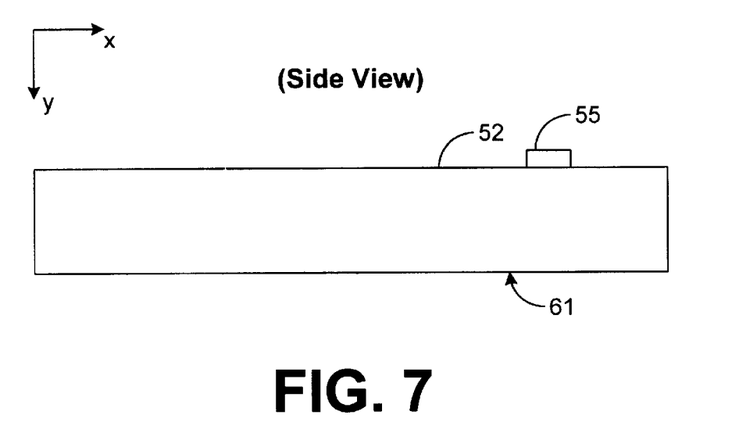
FIG. 7 is a diagram illustrating the substrate of FIG. 6 after forming a dopant on the top surface of the substrate.
Figure 8:
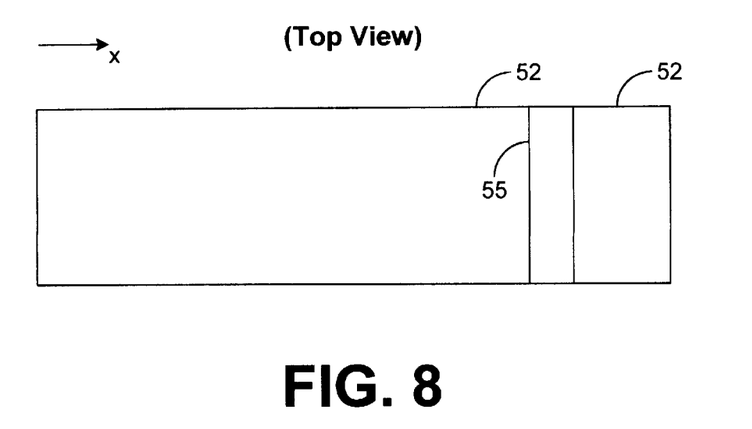
FIG. 8 is a diagram illustrating a top view of the substrate depicted in FIG. 7.

As shown by FIGS. 7 and 8, a dopant 55 is formed on substrate 52 via any suitable micromachining process (e.g., electron beam deposition). In the preferred embodiment, the dopant 55 stretches across the entire length of the top surface of the substrate 52, as shown by FIG. 8. However, as will be described in more detail hereinafter, it is not necessary for the dopant 55 to stretch across the entire length of the top surface in all embodiments.

The dopant 55 is preferably comprised of a material that, when thermomigrated through a region of the substrate 52, alters the electrical properties of the region. In the preferred embodiment, the dopant 55 is comprised of aluminum or some other suitable p-type dopant that, when thermomigrated through a region of the substrate 52, changes the region to a p-type region.

After formation of the dopant 55, the dopant 55 is thermomigrated through the substrate 52. In this regard, the bottom surface 61 (FIG. 7) of the substrate 52 is heated to create a thermal gradient through the substrate 52 in a direction substantially parallel to the y-direction. The foregoing may be accomplished by placing the substrate 52 in a vacuum chamber (not shown) with a heating filament (not shown) placed close to the surface 61 of the substrate 52. The amount of heat generated should be sufficient for thermomigrating the dopant 55 through the substrate 52. In experiments, to thermomigrate a five micron thick dopant 55 through a 250–300 micron thick SCS substrate, thereby altering the conductivity in the region through which the thermomigration occurred, the bottom surface of the substrate was heated to approximately 1200 degrees Celsius for about ten to twenty minutes.

Figure 9:
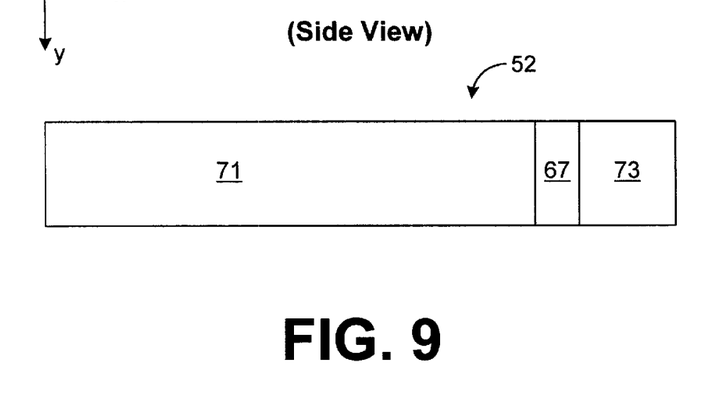
FIG. 9 is a diagram illustrating the substrate of FIG. 7 after thermomigrating the dopant through the substrate.
Figure 10:
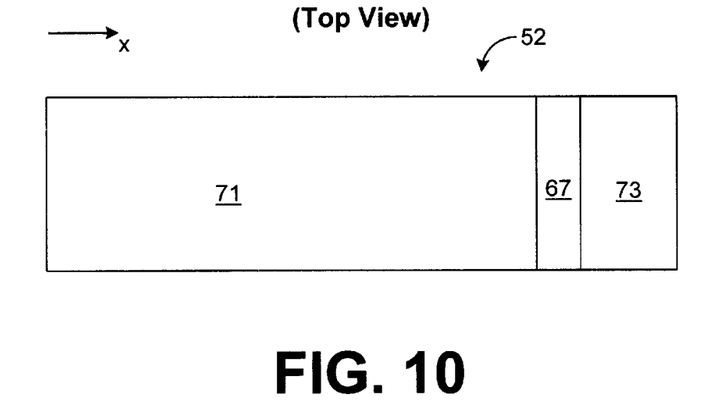
FIG. 10 is a diagram illustrating a top view of the substrate depicted in FIG. 9.

FIGS. 9 and 10 depict the substrate 52 after the dopant 55 has been thermomigrated through the substrate 52. In this regard, FIGS. 9 and 10 depict a region 67 through which the dopant 55 is thermomigrated. This region 67 should be a p-type material in the preferred embodiment once the thermomigration is performed and should separate the two n-type regions 71 and 73. The electrical properties of the region 67 should be sufficient for preventing electrical current from flowing between the two n-type regions 71 and 73. Note that the width (i.e., distance in the x-direction) of the region 67 should be approximately the same as the width of the dopant 55 in FIG. 8, as thermomigration (due to its anisotropic nature as caused by the applied thermal gradient) does not typically cause a significant change to the width of the material being thermomigrated.

Since the region 67 prevents electrical current from flowing between regions 71 and 73, the regions 71 and 73 are electrically isolated from each other. Electrical isolation, such as the isolation between regions 71 and 73, enabled by a p-n-p junction or n-p-n junction within a semiconductor is sometimes referred to as "junction isolation."

After thermomigration of the dopant 55, at least one movable component is formed in the substrate 52 through any suitable micromachining technique, such as ICP-RIE, for example. The movable component should be formed in region 71 so that the movable component is electrically isolated from region 73 via the junction formed by regions 67, 71, and 73. For example, in the embodiment shown by FIG. 11, a spring 82, a rotor 83, and a stator 84 are etched into the region 71. The spring 82 and rotor 83 are movable with respect to stator 84 and with respect to region 73. In other embodiments, other types of movable components and other combinations of movable components may be formed in the region 71. In forming the components 82–84, portions of the region 67 may or may not be etched. As an example, refer to FIG. 12, which shows an embodiment where the region 67 is etched.

Figure 11:
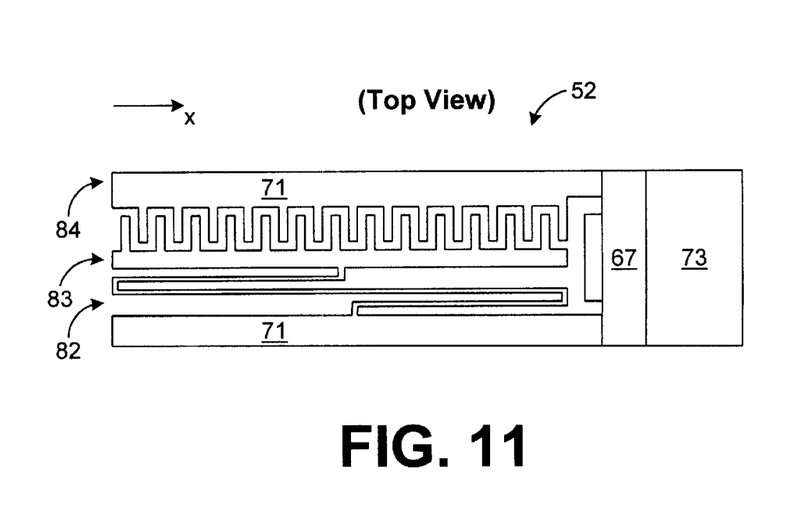
FIG. 11 is a diagram illustrating the substrate of FIG. 10 after forming movable components in the substrate.
Figure 12:
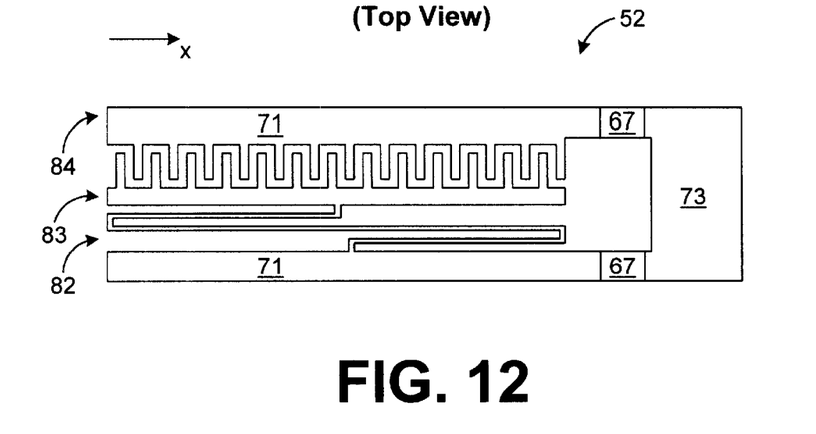
FIG. 12 is a diagram illustrating the substrate of FIG. 10 after forming movable components in the substrate in which a portion of the doped region has been etched away.

As a result of the foregoing methodology, the region 73 of substrate 52 provides mechanical support for each of the components 82–84 but is electrically isolated from each of the components 82–84. Such electrical isolation is achieved without compromising the mechanical integrity of the substrate. Further, a gap exists between rotor 83 and stator 84, and the stator 84 is, therefore, electrically isolated from the spring 82 and the rotor 83. As a result, any voltage difference applied across rotor 83 and stator 84 should not be shorted out by the region 73 depending on the material of the rotor 83 and stator 84, the size of the gap between rotor 83 and stator 84, and the amount of voltage difference applied to the rotor 83 and stator 84. Such a voltage difference, therefore, may cause the rotor 83 to move with respect to the stator 84.

It should be noted that it is not necessary to extend the dopant 55 across the entire length of the top surface of the substrate 52, as is shown in FIG. 8. It is also not necessary for both the rotor 83 (i.e., a movable component) and the stator 84 (i.e., another component of region 71) to be electrically isolated from region 73.

Figure 13:
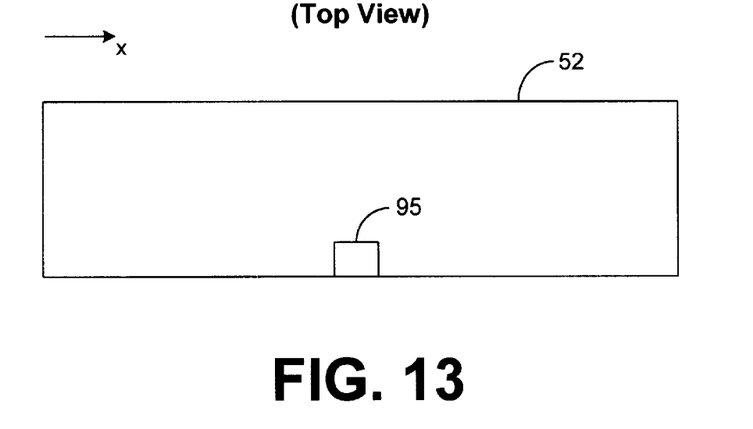
FIG. 13 is a diagram illustrating the substrate depicted in FIG. 8 when a dopant is formed on the substrate in a different pattern.
Figure 14:
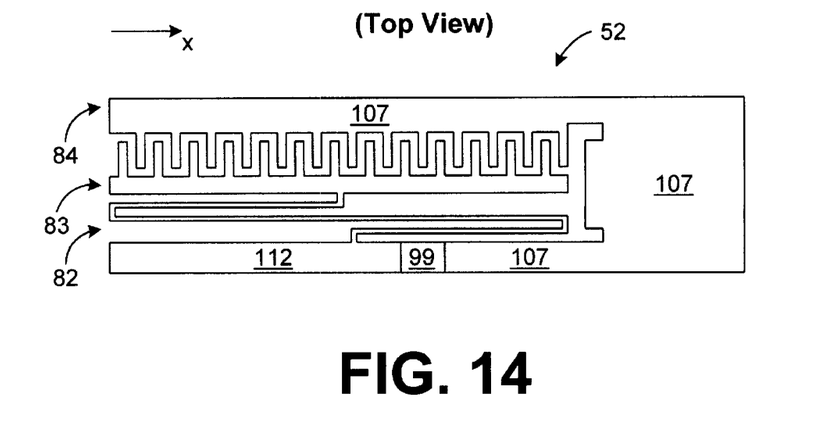
FIG. 14 is a diagram illustrating a top view of the substrate depicted in FIG. 13 after the dopant has been thermomigrated through the substrate and after movable components have been formed in the substrate.

FIGS. 13 and 14 show an embodiment in which a dopant 95 is formed without extending the dopant 95 across the entire length of the substrate 52. When the dopant 95 is thermomigrated through the substrate 52 to form a doped region 99, the region 99 through which the dopant 95 is thermomigrated electrically isolates portions of movable components 82 and 83 from movable component 84 such that a voltage difference can be applied across the components 83 and 84 without being shorted out. In this regard, region 107 is electrically isolated from region 112 via doped region 99, which extends from the top surface shown by FIG. 13 to the opposite surface of the substrate 52. Therefore, different voltages may be applied to regions 107 and 112 without being shorted out.

Materials other than the materials described herein can be used to implement the present invention. For example, it may be possible for the substrate 52 to be comprised of an n-type material other than SCS and for the dopant 55 to be comprised of a p-type material other than aluminum. Further, it may be possible for the substrate 52 to be comprised of a p-type material, and it may be possible for the dopant to be comprised of an n-type material such that a p-n-p junction is formed via regions 71, 67, and 73, respectively, or via regions 112, 99, and 107, respectively. The use of any materials that electrically isolate movable component 83 according to the thermomigration techniques described herein may be employed without departing from the principles of the present invention.

In addition, the methodology of the present invention has been described herein as thermomigrating a dopant 55 or 95 through the substrate 52 and then etching the substrate 52 to form the components 82–84. However, it should be apparent to one skilled in the art upon reading this disclosure that these steps may be reversed. In particular, the components 82–84 may be formed before the dopant 55 is thermomigrated through the substrate 52.

Furthermore, it may be desirable to anneal the substrate 52 at some point in the manufacturing process via conventional techniques to reduce mechanical stresses within the resulting structure. Also, electrical circuitry components (not shown) may be formed on the substrate 52 either before or after the thermomigration process described herein.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

Now, therefore, the following is claimed:

1. A method for electrically isolating movable components in micromachined structures, comprising the steps of:

providing a substrate;

thernomigrating a dopant through said substrate to form a doped region within said substrate;

enabling movement of a first portion of said substrate relative to a second portion of said substrate; and simultaneously applying a first voltage to said first portion and a different voltage to said second portion, thereby inducing movement of said first portion, wherein said doped region electrically isolates said first portion from said second portion.

2. The method of claim 1, wherein said doped region resides between said first and second portions.

3. The method of claim 1, wherein said enabling step includes the step of etching said substrate.

4. The method of claim 1, wherein said first portion is comprised of an n-type semiconductive material, and wherein said doped region is p-type.

5. The method of claim 1, wherein said first portion is comprised of a p-type material, and wherein said doped region is n-type.

6. The method of claim 1, wherein said thermomigrating step includes the steps of:

forming said dopant on a first surface of said substrate; and heating a second surface of said substrate until said dopant passes from said first surface to said second surface, said second surface opposite of said first surface.

7. The method of claim 6, wherein a distance between said first surface and said second surface is at least approximately 25 microns.

8. The method of claim 1, wherein said substrate is comprised of single crystal silicon.

9. The method of claim 8, wherein said dopant is comprised of aluminum.

10. A method, comprising the steps of:
providing a substrate;
enabling movement of a first portion of said substrate relative to a second portion of said substrate;
electrically isolating said first portion from said second portion, said electrically isolating step comprising the step of thermomigrating a dopant through said substrate; and
inducing movement of said first portion, said inducing step comprising the step of applying a voltage difference across said first and second portions.

11. The method of claim 10, wherein said enabling step includes the step of etching said substrate.

12. The method of claim 10, wherein said first portion is comprised of an n-type semiconductive material, and wherein said thermomigrating step forms a p-type region in said substrate.

13. The method of claim 10, wherein said first portion is comprised of a p-type material, and wherein said thermomigrating step forms an n-type region in said substrate.

14. The method of claim 10, further comprising the step of applying a voltage difference across said first and second portions to induce movement of said first portion.

15. The method of claim 10, wherein said thermomigrating step includes the steps of:
forming said dopant on a first surface of said substrate; and
heating a second surface of said substrate until said dopant passes from said first surface to said second surface, said second surface opposite of said first surface.

16. The method of claim 10, wherein said substrate is comprised of single crystal silicon.

17. The method of claim 16, wherein said dopant is comprised of aluminum.

18. A method for electrically isolating movable components in micromachined structures, comprising the steps of:
providing a semiconductive substrate, said substrate having a first portion and a movable portion;
thermomigrating a dopant through said substrate to form a doped region within said substrate, said doped region having sufficient electrical properties for restricting current from flowing between said first portion and said movable portion when a voltage difference applied across said first portion and said movable portion is sufficient for moving said movable portion; and
applying said voltage difference across said first portion and said movable portion.

19. The method of claim 18, wherein said doped region separates said first portion from said movable portion.

20. A method for electrically isolating movable components in micromachined structures, comprising the steps of:
providing a semiconductive substrate, said substrate having a first portion and a movable portion;
thermomigrating a dopant through said substrate to form a doped region within said substrate, said doped region having sufficient electrical properties for restricting current from flowing between said first portion and said movable portion when a voltage difference applied across said first portion and said movable portion is sufficient for moving said movable portion, said doped region extending from a top surface of said substrate to a bottom surface of said substrate; and
forming a gap in said substrate, said gap separating said first portion from said second portion and extending from said top surface to said bottom surface.

21. The method of claim 18, wherein said movable portion is comprised of an n-type semiconductive material, and wherein said doped region is comprised of a p-type material.

22. The method of claim 18, wherein said movable portion is comprised of a p-type material, and wherein said doped region is comprised of an n-type semiconductive material.

23. The method of claim 18, wherein said substrate is comprised of single crystal silicon.

24. The method of claim 23, wherein said doping step includes the step of introducing aluminum to said doped region.

25. A method, comprising the steps of:
providing a substrate, said substrate having a first surface and a second surface, said first surface opposite of said second surface and separated from said second surface by a distance of at least approximately 25 microns;
electrically isolating a first portion of said substrate from a second portion of said substrate, said electrically isolating step comprising the step of forming a doped region in said substrate by thermomigrating a dopant through said substrate from said first surface to said second surface, said doped region separating said first portion from said second portion;
enabling movement of said first portion relative to said second portion; and
inducing movement of said first portion, said inducing step comprising the step of applying a voltage difference across said first and second portions.

26. The method of claim 1, wherein said enabling step comprises the step of forming a gap in said substrate, said gap extending from a top surface of said substrate to a bottom surface of said substrate, and wherein said doped region extends from said top surface to said bottom surface.

27. The method of claim 10, wherein said enabling step comprises the step of forming a gap in said substrate, said gap extending from a top surface of said substrate to a bottom surface of said substrate, and wherein said thermomigrating step forms a doped region in said substrate, said doped region extending from said top surface to said bottom surface.

28. A method, comprising the steps of:
providing a substrate;
enabling movement of a first portion of said substrate relative to a second portion of said substrate, said enabling step comprising the step of forming a gap in said substrate, said gap separating said first portion from said second portion and extending from a first surface of said substrate to a second surface of said substrate, said first surface opposite of said second surface; and
electrically isolating said first portion from said second portion, said electrically isolating step comprising the step of thermomigrating a dopant through said substrate from said first surface to said second surface.

29. A method comprising the steps of:
providing a substrate; and
enabling a first portion of said substrate to be moved relative to a second portion of said substrate when a voltage difference is applied across said first and second portions, said enabling step comprising the steps of:
thermomigrating a dopant through said substrate to electrically separate said first portion from said second portion;

forming a gap in said substrate; and enabling said voltage difference to be applied across said first and second portions.

30. The method of claim 29, wherein said thermomigrating step forms a doped region in said substrate, said doped region extending from a top surface of said substrate to a bottom surface of said substrate, and wherein said gap extends from said top surface to said bottom surface.

* * * * *